United States Patent
Koch et al.

(10) Patent No.: US 7,692,280 B2
(45) Date of Patent: Apr. 6, 2010

(54) PORTABLE OBJECT CONNECTABLE PACKAGE

(75) Inventors: Stefan Marco Koch, Zürich (CH);
Heinz-Peter Wirtz, Doettingen (CH);
Alexander M. Jooss, Limburgerhof (DE)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 11/910,449

(22) PCT Filed: Mar. 21, 2006

(86) PCT No.: PCT/IB2006/050857

§ 371 (c)(1),
(2), (4) Date: May 13, 2008

(87) PCT Pub. No.: WO2006/103592

PCT Pub. Date: Oct. 5, 2006

(65) Prior Publication Data

US 2008/0224288 A1    Sep. 18, 2008

(30) Foreign Application Priority Data

Mar. 30, 2005    (EP) ................... 05300228

(51) Int. Cl.
| | |
|---|---|
| H01L 23/48 | (2006.01) |
| H01L 23/02 | (2006.01) |
| H01L 23/34 | (2006.01) |
| H01L 23/52 | (2006.01) |
| H01L 29/40 | (2006.01) |

(52) U.S. Cl. ............ 257/688; 257/685; 257/686; 257/725; 257/785; 257/E23.001; 257/E23.078

(58) Field of Classification Search ......... 257/685–686, 257/688, 725, 785, E23.001, E23.078
See application file for complete search history.

(56) References Cited

U.S. PATENT DOCUMENTS

| | | | | | |
|---|---|---|---|---|---|
| 5,705,853 | A | * | 1/1998 | Faller et al. ............. | 257/719 |
| 5,986,886 | A | * | 11/1999 | Sasov ..................... | 361/704 |
| 6,078,500 | A | * | 6/2000 | Beaman et al. .......... | 361/704 |
| 6,274,823 | B1 | * | 8/2001 | Khandros et al. ....... | 174/261 |
| 6,297,549 | B1 | * | 10/2001 | Hiyoshi .................. | 257/703 |
| 6,330,164 | B1 | * | 12/2001 | Khandros et al. ....... | 361/760 |

(Continued)

FOREIGN PATENT DOCUMENTS

EP    1205869 A1    5/2002

(Continued)

*Primary Examiner*—Ida M Soward
(74) *Attorney, Agent, or Firm*—Robert Iannucci; Seed IP Law Group PLLC (57) ABSTRACT

A portable object connectable package for an electronic device comprises: semiconductor die package, having a top surface and an opposite bottom surface, and a connector body mechanically supported by the semiconductor die package. The bottom surface includes a plurality of connection elements for connecting to a printed circuit board. The connector body includes a plurality of resilient electrical connecting elements extending over the top surface for contacting with a portable object PO having a contacting area. The portable object connectable package is arranged to be coupled to a portable object positioner for removably positioning the contacting area of the portable object in contact with the plurality of resilient electrical connecting elements when the portable object is present in the portable object positioner.

32 Claims, 9 Drawing Sheets

U.S. PATENT DOCUMENTS

| | | | |
|---|---|---|---|
| 6,403,892 B1* | 6/2002 | Feger et al. | 174/254 |
| 6,462,952 B1* | 10/2002 | Ubukata et al. | 361/719 |
| 6,586,845 B1* | 7/2003 | Higashi et al. | 257/784 |
| 6,589,819 B2* | 7/2003 | Smith et al. | 438/123 |
| 6,695,623 B2* | 2/2004 | Brodsky et al. | 439/66 |
| 6,876,212 B2* | 4/2005 | Fjelstad | 324/754 |
| 6,977,434 B2* | 12/2005 | Martino | 257/727 |
| 7,057,295 B2* | 6/2006 | Ju | 257/784 |
| 7,208,833 B2* | 4/2007 | Nobori et al. | 257/704 |
| 7,335,979 B2* | 2/2008 | Walk | 257/700 |
| 7,427,809 B2* | 9/2008 | Salmon | 257/773 |
| 7,518,775 B2* | 4/2009 | Miles et al. | 359/238 |
| 2002/0031905 A1* | 3/2002 | Beroz | 438/617 |
| 2002/0056922 A1* | 5/2002 | Funaya et al. | 257/778 |
| 2002/0074081 A1* | 6/2002 | Haba | 156/249 |
| 2002/0179330 A1* | 12/2002 | Carson | 174/260 |
| 2003/0048624 A1* | 3/2003 | Damberg et al. | 361/803 |
| 2005/0064626 A1* | 3/2005 | Light et al. | 438/106 |

FOREIGN PATENT DOCUMENTS

| | | |
|---|---|---|
| FR | 2805671 A1 | 8/2001 |
| WO | 9602411 A1 | 8/1996 |
| WO | 2004029858 A1 | 4/2004 |

* cited by examiner

FIG. 9.C ns ductor die package and at least one abutment for limiting the movement of the portable object relatively to the connector body.

Thus, the invention is particularly well adapted for applications into portable electronic devices, which are submitted to limitations in implementation size (weight, size, battery life) while always offering more and more functions.

With the invention, it is possible to integrate more functions in the same limited size, namely a portable object connector and a semiconductor die package. Thus the size on the printed circuit board that would have been occupied by the connector separated from the semiconductor die package is optimized or available for others features.

In addition, the invention enables the semiconductor die within the package to be electrically isolated from the connector body. Thus, the semiconductor die and the connector body can be made electrically independent. With the invention, the printed circuit board designer has more flexibility because he can choose the functions associated with the semiconductor die of the package.

Further, the portable object connectable package of the invention may be positioned centrally on the printed circuit board. This is advantageous because the semiconductor package may then include sensitive components. A central position is a valuable position for speed, interference and accessibility reasons. Moreover, the central location of the portable object connectable package is also advantageous for connecting a SIM card, by limiting user insertion problems.

The invention is also particularly suited for connecting electronic circuits of different form factors, e.g. the semiconductor package and the portable object. Advantageously, this connection does not impair the advantage for a user to removably insert the portable object into the portable object connectable package, i.e. connect and disconnect the portable object from the semiconductor die package on wish and in an easy manner.

Finally, the portable object connectable package is economic to manufacture due to the relatively low complexity of the overall structure, and due to the independence between the semiconductor die package and the connector body.

These and other aspects of the invention will be apparent from and elucidated with reference to the embodiments described hereinafter.

BRIEF DESCRIPTION OF THE DRAWINGS

The present invention is illustrated by way of example and not limited to the accompanying figures, in which like references indicate similar elements.

DETAILED DESCRIPTION OF THE INVENTION

Figure 1:
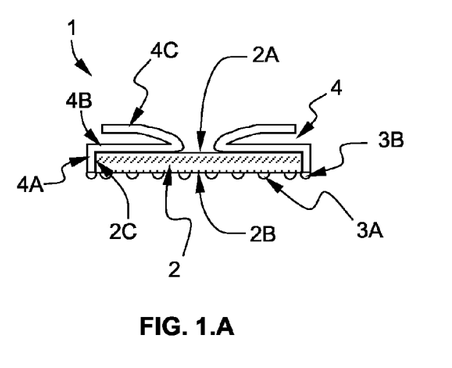
FIGS. 1A, 1B and 1C are a side view, a top view and a perspective top view, respectively, which schematically illustrate a portable object connectable package according to a first embodiment of the invention.
FIGS. 1D and 1E are cross section side views which schematically illustrate the connection of a portable object under the form of a SIM card with the portable object connectable package according to the first embodiment of the invention.
FIGS. 1F and 1G are perspective top views which schematically illustrate the connection of the SIM card with the portable object connectable package according to the first embodiment of the invention.
Figure 2:
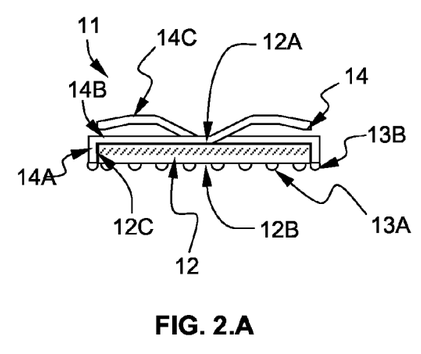
FIGS. 2A, 2B and 2C are a side view, a top view and a perspective top view, respectively, which schematically illustrate a portable object connectable package according to a second embodiment of the invention.
FIG. 2D is a side view which schematically illustrates the connection of a portable object with the portable object connectable package according to the second embodiment of the invention.
Figure 3:
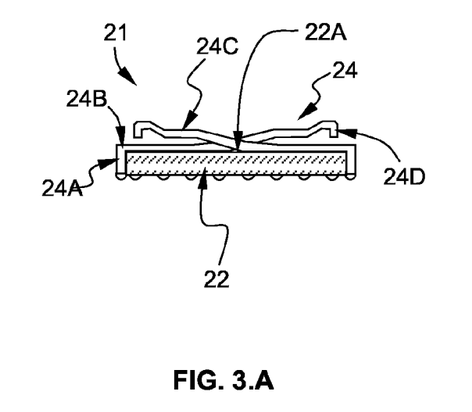
FIGS. 3A, 3B and 3C are a side view, a top view and a perspective top view, respectively, which schematically illustrate a portable object connectable package according to a third embodiment of the invention.
FIG. 3D is a side view which schematically illustrates the connection of a portable object with the portable object connectable package according to the third embodiment of the invention.
Figure 4:
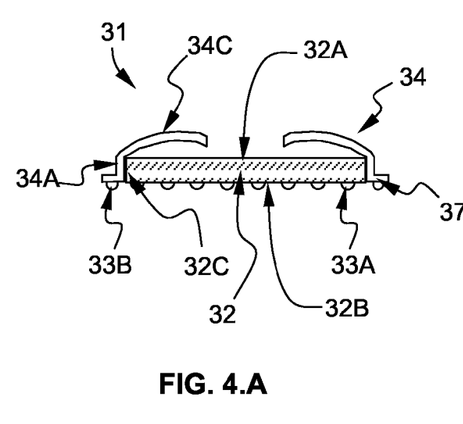
FIGS. 4A, 4B and 4C are a side view, a top view and a perspective top view, respectively, which schematically illustrate a portable object connectable package according to a fourth embodiment of the invention.
FIG. 4D is a side view which schematically illustrates the connection of a portable object with the portable object connectable package according to the fourth embodiment of the invention.
Figure 5:
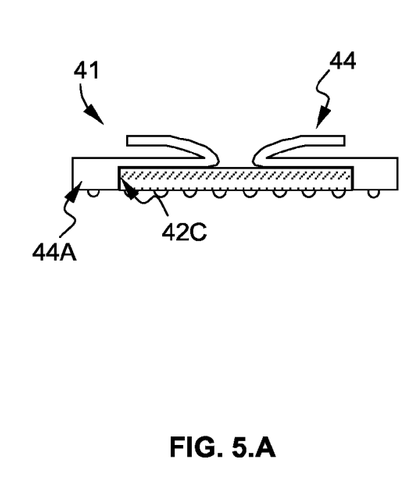
FIGS. 5A, 5B and 5C are a side view, a top view and a perspective top view, respectively, which schematically illustrate an alternative for a portable object connectable package according to any of the embodiments of the invention.
Figure 6:
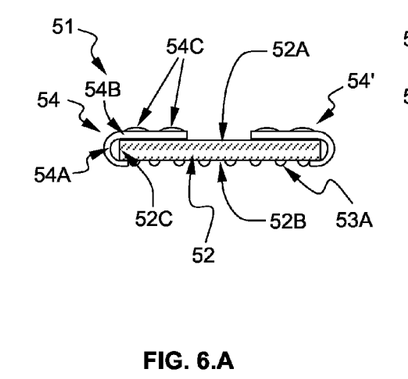
FIGS. 6A, 6B and 6C are a side view, a top view and a perspective top view, respectively, which schematically illustrate a portable object connectable package according to a fifth embodiment of the invention.
FIG. 6D is a side view which schematically illustrates the connection of a portable object with the portable object connectable package according to the fifth embodiment of the invention.
Figure 7:
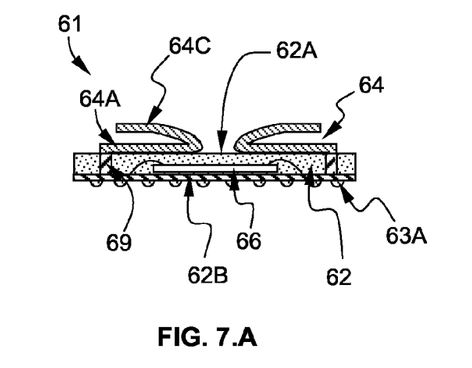
FIGS. 7A, 7B and 7C are a cross section side view, a top view and a perspective top view, respectively, which schematically illustrate a portable object connectable package according to a sixth embodiment of the invention.
Figure 8:
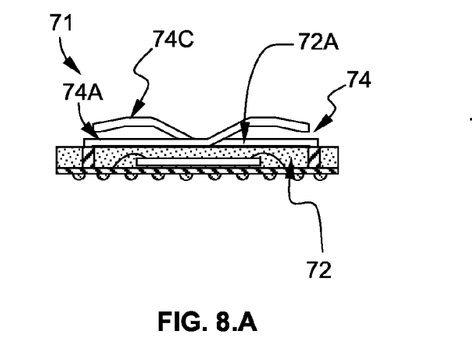
FIGS. 8A, 8B and 8C are a cross section side view, a top view and a perspective top view, respectively, which schematically illustrate a portable object connectable package according to a seventh embodiment of the invention.
Figure 9:
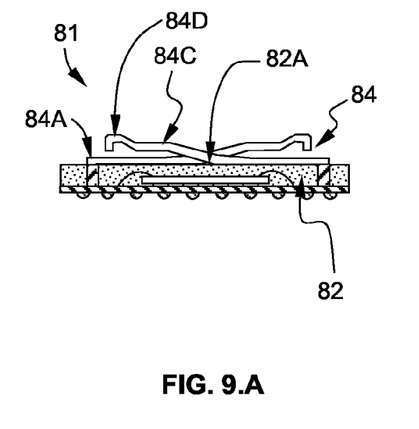
FIGS. 9A, 9B and 9C are a cross section side view, a top view and a perspective top view, respectively, which schematically illustrate a portable object connectable package according to a eighth embodiment of the invention.

FIGS. 1A, 1B and 1C schematically show a side view, a top view and a perspective top view of a portable object connectable package 1 according to a first embodiment of the invention, respectively.

The portable object connectable package 1 comprises a semiconductor die package 2, a connector body 4 and a portable object positioner (shown in FIG. 1G for clarity purpose).

The semiconductor die package 2 comprises a top surface 2A, a bottom surface 2B opposite to the top surface, and side surfaces 2C extending sensibly vertically between the top surface and the opposite bottom surface.

The bottom surface 2B comprises a plurality of connection elements 3A for connecting to a printed circuit board.

The connector body 4 comprises a plurality of resilient electrical connecting elements extending over the top surface 2A. The connector body 4 is mechanically supported by the semiconductor die package. Each resilient electrical connecting element may be electrically connected to the printed circuit board via a plurality of connection elements 3B similar to the one used for connecting the semiconductor die package to the printed circuit board.

Each connecting element of the plurality of resilient electrical connecting elements comprises a connecting lead. The connecting lead comprises a supporting portion 4A, an intermediate portion 4B and a contacting portion 4C.

The intermediate portion 4B is positioned between the supporting portion 4A and the contacting portion 4C. The supporting portion 4A and the intermediate portion 4B are mechanically supported by the side surface 2C. The intermediate portion 4B extends substantially on half the length of the semiconductor die package top surface 2A. The contacting portion 4C protrudes substantially diagonally from the intermediate portion 4B over the top surface 2A towards the side of the semiconductor die package.

In the present example, the plurality of resilient electrical connecting elements comprises six connecting leads. The connecting leads extend two by two on half the length of the semiconductor die package top surface 2A from opposite side surface. The connecting leads face each other two by two.

FIG. 1D is a cross section side views which schematically illustrate a portable object PO and the portable object connectable package 1 of the first embodiment of the invention according to a pre-connection state.

The portable object PO is for example a SIM card. The portable object may typically comprise a semiconductor die PO2 embedded in a plastic card body and coupled to a contact area. The contact area may comprise a plurality of portable object contacts PO1.

The portable object connectable package 1 is connected to a printed circuit board PCB. In this example, a first connecting lead 4 is connected to a first connection path CP1 of the printed circuit board PCB and a second connecting lead 4' is connected to a second connection path CP2 by means of the plurality of connection elements 3B. Optionally, additional components (for example ESD protection, pull-up, or pull-down resistors) may be connected between the connecting lead 4, 4' and the printed circuit board PCB.

The semiconductor die package 2 may comprise at least one semiconductor die 6 which is connected to connection paths (not shown) by means of the plurality of connection elements 3A.

The semiconductor die 6 within the package 2 can be electrically isolated from the connector body 4. Thus, the semiconductor die and the connector body can be made electrically independent from each other. Consequently, the printed circuit board designer can choose a function associated with the semiconductor die which is totally different from the connecting function of the connector body.

FIG. 1E is a cross section side view which schematically illustrates a portable object PO and the portable object connectable package 1 of the first embodiment of the invention in a connection state. FIG. 1F is a perspective top view schematically showing the portable object PO connected with the portable object connectable package 1.

When the portable object PO is coupled to the portable object connectable package 1, each contacting portion 4C from each lead contacts the corresponding portable object contacts PO1. The resilience of each connecting lead enables each contacting portion 4C to bend. Depending on the force applied, the contacting portion 4C may contact by its end the intermediate portion 4B. In any case, a firm contact is established between the connecting leads and the portable object. When the portable object PO is decoupled from the portable object connectable package, the connecting leads recover due to a spring-like effect their initial shape and position over the top surface of the semiconductor die package. The resilience of the connecting leads enables the portable object to move relatively to the top surface of the semiconductor die package in a direction substantially perpendicular to the top surface.

FIG. 1G is a perspective top view schematically showing the connection of the portable object PO with the portable object connectable package 1 of the first embodiment. The contacting area of the portable object is guided, positioned and maintained in contact with the plurality of resilient electrical connecting elements by means of the portable object positioner 5. The portable object positioner 5 comprises a package frame 5A, a first 5B and a second 5C abutment. The package frame 5A is coupled and appropriately secured to the portable object connectable package 1. The portable object positioner can be made of one or several pieces.

When the portable object PO is inserted into the portable object positioner 5, the first 5B and a second 5C abutment enables a correct lateral and height positioning of the portable object PO with regards to the portable object connectable package 1, respectively. Thus, the combination of the resilient connecting elements and the positioner enables obtaining an optimal electrical connection. Further, the portable object PO can be contacted or removed from the portable object connectable package 1 reliably, safely and easily.

It will be apparent for a man skilled in the art, that the portable object positioner is not limited to the particular example of FIG. 1G. Any other portable object positioner insuring a proper position of the portable object over the connector body is convenient. Advantageously, the portable object positioner is designed to minimize the printed circuit board space utilization.

Further, it will be apparent for a man skilled in the art, that the portable object positioner is not necessarily coupled to the portable object connectable package. For example, the portable object positioner may belong to another part of the device in which the portable object connectable package is fitted, said part facing the connecting elements.

The others embodiments of the invention will be described in relation with FIGS. 2 to 9. For clarity purpose, the portable object positioner is not shown on these Figures. The portable object positioner and its alternatives may be similar to the ones described hereinbefore in relation with FIG. 1G.

Similarly, the internal structure of the semiconductor die package is not shown on the FIGS. 2 to 6. In particular, the semiconductor die within the package may be electrically isolated from the connector body enabling an electrical independence of the die and the connector body.

Further, the printed circuit board is omitted in FIGS. 2 to 9, but is similar to the one shown in FIGS. 1D and 1E.

FIGS. 2A, 2B and 2C schematically show a side view, a top view and a perspective top view of a portable object connectable package 11 according to a second embodiment of the invention, respectively.

The portable object connectable package 11 comprises a semiconductor die package 12, a connector body 14 and a portable object positioner. The semiconductor die package 12 comprises a top surface 12A, a bottom surface 12B opposite to the top surface and side surfaces 12C extending sensibly vertically between the top surface and the opposite bottom surface. The bottom surface comprises a plurality of connection elements 13A for connecting to a printed circuit board. The connector body 14 comprises a plurality of resilient electrical connecting elements extending over the top surface 12A. The connector body 14 is mechanically supported by the semiconductor die package. Each resilient electrical connecting element may be electrically connected to the printed circuit board via a plurality of connection elements 13B used for connecting the semiconductor die package to the printed circuit board.

Each connecting element of the plurality of resilient electrical connecting elements comprises a connecting lead. The connecting lead comprises a supporting portion 14A, an intermediate portion 14B and a contacting portion 14C. The intermediate portion 14B is positioned between the supporting portion 14A and the contacting portion 14C. The supporting portion 14A is mechanically supported by the side surface 12C. The intermediate portion 14B is mechanically supported by the top surface 12A. The intermediate portion 14B extends substantially on half the length of the semiconductor die package top surface 12A.

The contacting portion 14C protrudes substantially diagonally from the intermediate portion 14B over the top surface 12A towards the opposite side of the semiconductor die package 12. Advantageously, the contacting portion 14C comprises a first contacting portion and a second contacting portion. The first portion protrudes substantially diagonally from the intermediate portion 14B over the top surface 12A. The second portion may extend from the first portion substantially parallel to the top surface 12A or may be bent towards the top surface 12A.

In the present example, the plurality of resilient electrical connecting elements comprises six connecting leads. The connecting leads extend two by two on substantially the entire length of the semiconductor die package top surface 12A from opposite side surface. The intermediate portion 14B and the contacting portion 14C widths are less than half the width of the supporting portion 14A. The connecting leads face each other two by two, each intermediate portion 14B and contacting portion 14C from a first lead being shifted from a second lead. Thus, the occurrence of electrical short-cuts is avoided.

FIG. 2D is a side view schematically illustrating a portable object PO and the portable object connectable package 11 of the second embodiment of the invention in a connection state. When the portable object PO is coupled to the portable object connectable package 11, each contacting portion 14C from each lead contacts the corresponding portable object contacts. The resilience of each contacting lead enables each contacting portion 14C to bend and move relatively to the top surface 12A in a direction substantially perpendicular to the top surface. Depending on the force applied, the contacting portion 14C may contact by its end the top surface 12A. In any case, a firm contact is established between the contacting portion 14C of the connecting leads and the portable object. When the portable object PO is decoupled from the portable object connectable package, the connecting leads recover due to a spring-like effect their initial shape and position over the top surface of the semiconductor die package.

The second embodiment of the invention induces less mechanical stress on the connector body, thus improving reliability.

FIGS. 3A, 3B and 3C schematically show a side view, a top view and a perspective top view of a portable object connectable package 21 according to a third embodiment of the invention, respectively.

The portable object connectable package 21 comprises a semiconductor die package 22, a connector body 24 and a portable object positioner. The third embodiment of the invention differs from the second embodiment of the invention described hereinbefore by the shape of the end of the contacting portion 24C. According to this embodiment, the contacting portion 24C further comprises a sensibly crook shaped distal part 24D. The crook is directed towards the top surface 22A.

FIG. 3D is a side view schematically illustrating a portable object PO and the portable object connectable package 21 of the third embodiment of the invention in a connection state. When the portable object PO is coupled to the portable object connectable package 21, each crook shaped distal part 24D from each lead contacts the corresponding portable object contacts. The resilience of each contacting lead enables each contacting portion 24C to bend. Depending on the force applied, a part of the contacting portion 14C and the end of the crook shaped distal part 24D may contact the top surface 12A. In any case, a firm contact is established between the crook shaped distal part 24D of the connecting leads and the portable object. When the portable object PO is decoupled from the portable object connectable package, the connecting leads recover due to a spring-like effect their initial shape and position over the top surface of the semiconductor die package.

The third embodiment of the invention allows more pressure to be applied on the portable object in order to improve connectivity. Further, it enables less precaution to be taken while avoiding short-cuts between two leads.

FIGS. 4A, 4B and 4C schematically show a side view, a top view and a perspective top view of a portable object connectable package 31 according to a fourth embodiment of the invention, respectively.

The portable object connectable package 31 comprises a semiconductor die package 32, a connector body 34 and a portable object positioner. The semiconductor die package 32 comprises a top surface 32A, a bottom surface 32B opposite to the top surface and side surfaces 32C extending sensibly vertically between the top surface and the opposite bottom surface. The bottom surface comprises a plurality of connection elements 33A for connecting to a printed circuit board.

The connector body 34 comprises a plurality of resilient electrical connecting elements extending over the top surface 32A. The connector body 34 is mechanically supported by the semiconductor die package. Each resilient electrical connecting element may be electrically connected to the printed circuit board via a plurality of connection elements 33B used for connecting the semiconductor die package to the printed circuit board.

Each connecting element of the plurality of resilient electrical connecting elements comprises a connecting lead. The connecting lead comprises a supporting portion 34A and a contacting portion 34C. The supporting portion 34A is mechanically supported by the side surface 32C. The contacting portion 34C protrudes substantially diagonally from the supporting portion 34A over the top surface 32A towards the opposite side of the semiconductor die package 32. The contacting portion 34C may be bent towards the top surface 32A in a movement having a direction substantially perpendicular to the top surface 32A. Each connecting element further comprises an additional connector 37 extending from the supporting portion 34A, laterally and outwardly from the side surface 32C. The additional connector 37 may be used for establishing a direct connection with the printed circuit board.

In the present example, the plurality of resilient electrical connecting elements comprises six connecting leads. The connecting leads extend two by two on sensibly a third of the length of the semiconductor die package top surface 32A from opposite side surface. The connecting leads face each other two by two.

FIG. 4D is a side view schematically illustrating a portable object PO and the portable object connectable package 31 of the fourth embodiment of the invention in a connection state. When the portable object PO is coupled to the portable object connectable package 31, each contacting portion 34C from each lead contacts the corresponding portable object contacts. The resilience of each contacting lead enables each contacting portion 34C to bend. Depending on the force applied, the contacting portion 34C may contact by its end the top surface 32A. In any case, a firm contact is established between the contacting portion 34C of the connecting leads and the portable object. When the portable object PO is decoupled from the portable object connectable package, the connecting leads recover due to a spring-like effect their initial shape and position over the top surface of the semiconductor die package.

The fourth embodiment of the invention enables an improved stability and provides an improved resistance to mechanical stress. It also enables to drive more current through the leads.

FIGS. 5A, 5B and 5C schematically show a side view, a top view and a perspective top view illustrating an alternative for a portable object connectable package 41 according to any of the hereinbefore described embodiments of the invention.

The connecting lead comprises a massive supporting portion 44A. The supporting portion 44A is mechanically supported by the side surface 42C. The massive supporting portion 44A further comprises fins 48. The fins 48 extend from the supporting portion 44A, laterally and outwardly from the side surface 42C.

The massive supporting portion 44A may also be used for establishing a direct connection with the printed circuit board.

In the present example, the plurality of resilient electrical connecting elements comprises six connecting leads 44. Advantageously, two consecutive massive supporting portions 44A disposed on the same side surface 42C have a sensibly opposed shape. Thus, the fins 48 of two consecutive massive supporting portions 44A can be imbricated in each other. The massive supporting portions 44A and the fins 48 constitute a heat sink.

This alternative enables an improved stress resistance, to drive more current through the leads and improves heat dissipation.

It will be apparent for a person skilled in the art, that the hereinbefore wider connections to the printed circuit board for improved stability (FIG. 4), or massive connections for improved heat dissipation (FIG. 5) are alternatives that may be easily adapted to all the others embodiments hereinbefore presented.

Further, in the hereinbefore described embodiments, the connecting leads are positioned and partially supported on two sides of the semiconductor package. However, it will be apparent for a person skilled in the art that alternatively it is also possible to position the connectors on three sides, four sides, or only one side of the semiconductor package.

FIGS. 6A, 6B and 6C are a side view, a top view and a perspective top view, respectively, which schematically illustrate a portable object connectable package 51 according to a fifth embodiment of the invention.

The portable object connectable package 51 comprises a semiconductor die package 52, a connector body 54, 54' and a portable object positioner. The semiconductor die package 52 comprises a top surface 52A, a bottom surface 52B opposite to the top surface, and side surfaces 52C extending sensibly vertically between the top surface and the opposite bottom surface. The bottom surface 52B comprises a plurality of connection elements 53A for connecting to a printed circuit board.

The connector body comprises on a first side a first thin laminate 54 wrapped around a portion of the semiconductor package 52, and on a second opposite side a second thin laminate 54' wrapped around another portion of the semiconductor package 52. More precisely, the first thin laminate 54 comprises a first laminate part 54A wrapped around a portion of the bottom surface 52B and the side surface 52C, and a second laminate part 54B wrapped around a portion of the top surface 52A. The first 54A and second 54B laminate part are supported by the semiconductor package 52. The first thin laminate 54 further comprises an array of flexible contact 54C and traces 54D. Advantageously, the traces 54D are embedded inside the laminates 54, 54' and are connected to the flexible contact 54C. The second thin laminate 54' is similar to the first thin laminate 54.

The laminate may be connected to the semiconductor package after the packaging process. The traces 54D are connected to one or more connection elements 53A, mainly the one positioned on the outer border of the bottom surface.

Alternatively, the thin laminate 54, 54' may be replaced by a flexible foil or a tape.

FIG. 6D is a side view schematically illustrating a portable object PO and the portable object connectable package 51 of the fifth embodiment of the invention in a connection state. When the portable object PO is coupled to the portable object connectable package 51, each flexible contact 54C from each laminate 54, 54' is pressed and contacts the corresponding portable object contacts. The resilience property of each flexible contact of the array enables the portable object to move relatively to the top surface of the semiconductor die package in a direction substantially perpendicular to the top surface. The array of flexible contact 54C enables a firm contact to be established with the portable object. When the portable object PO is decoupled from the portable object connectable package, the array of flexible contact 54C recover its initial shape over the top surface of the semiconductor die package.

The fifth embodiment of the invention enables a high integration, allowing direct connection between the semiconductor die function and the module inserted on top.

The laminate enables to reduce the global height of the portable object connectable semiconductor package. Alternatively, the laminate enables an easy integration of components (for example ESD protection, pull-up resistors, or pull-down resistors) directly on the laminate.

FIGS. 7A, 7B and 7C are a cross section side view, a top view and a perspective top view, respectively, schematically showing a portable object connectable package 61 according to a sixth embodiment of the invention.

The portable object connectable package 61 comprises a semiconductor die package 62, a connector body 64 and a portable object positioner. The semiconductor die package 62 comprises a top surface 62A, a bottom surface 62B opposite to the top surface. The bottom surface 62B comprises a plurality of connection elements 63A for connecting to a printed circuit board. The semiconductor die package 62 comprises at least one semiconductor die 66 which is connected to the plurality of connection elements 63A by means of connection paths (not shown).

The connector body 64 comprises a plurality of resilient electrical connecting elements extending over the top surface 62A. The connector body 64 is mechanically supported by the semiconductor die package. Each resilient electrical connecting element is electrically connected to the semiconductor die 66 and/or to the printed circuit board through feed-through vias 69. The feed-through vias 69 are conductive parts enabling the electrical connection between the top and bottom surfaces of the semiconductor package 62.

Each connecting element of the plurality of resilient electrical connecting elements comprises a connecting lead. The connecting lead comprises a supporting portion 64A and a contacting portion 64C. The supporting portion 64A is mechanically supported by the top surface 62C. The contacting portion 4C protrudes substantially diagonally from one end of the contacting portion 64B over the top surface 62A and the supporting portion 64A towards the side of the semiconductor die package.

In the present example, the plurality of resilient electrical connecting elements comprises six connecting leads. The connecting leads extend two by two on half the length of the semiconductor die package top surface 62A from opposite side surface. The connecting leads face each other two by two.

A portable object, for example a SIM card, may be connected to the portable object connectable package 61 in an identical manner as hereinbefore described with regards to the first embodiment.

FIGS. 8A, 8B and 8C are a cross section side view, a top view and a perspective top view, respectively, schematically showing a portable object connectable package 71 according to a seventh embodiment of the invention.

The portable object connectable package 71 comprises a semiconductor die package 72, a connector body 74 and a portable object positioner. The seventh embodiment of the invention differs from the sixth embodiment of the invention described hereinbefore by the shape of the connecting element.

According to this embodiment, each connecting element of the plurality of resilient electrical connecting elements comprises a connecting lead. The connecting lead comprises a supporting portion 74A and a contacting portion 74C. The supporting portion 74A is mechanically supported by the top surface 72A. The supporting portion 74A extends substantially on half the length of the semiconductor die package top surface 72A.

The contacting portion 74C protrudes substantially diagonally from the supporting portion 74A over the top surface 72A towards a side of the semiconductor die package 72. Advantageously, the contacting portion 74C comprises a first contacting portion and a second contacting portion. The first portion protrudes substantially diagonally from the supporting portion 74A over the top surface 72A. The second portion may extend from the first portion substantially parallel to the top surface 72A or may be bent towards the top surface 72A.

In the present example, the plurality of resilient electrical connecting elements comprises six connecting leads. Two consecutive connecting leads present an inversed orientation. Hence, three supporting portions are positioned on one half area of the top surface, while the tree others supporting portions are positioned on the other half area of the top surface. The corresponding contacting portion protrudes alternatively towards a first side surface and towards a second opposite side surface.

A portable object, for example a SIM card, may be connected to the portable object connectable package 71 in an identical manner as hereinbefore described with regards to the third embodiment.

FIGS. 9A, 9B and 9C are a cross section side view, a top view and a perspective top view, respectively, schematically showing a portable object connectable package 81 according to a eighth embodiment of the invention.

The portable object connectable package 81 comprises a semiconductor die package 82, a connector body 84 and a portable object positioner. The eighth embodiment of the invention differs from the seventh embodiment of the invention described hereinbefore by the shape of the end of the contacting portion 84C. According to this embodiment, the contacting portion 84C further comprises a sensibly crook shaped distal part 84D. The crook is directed towards the top surface 82A.

A portable object, for example a SIM card, may be connected to the portable object connectable package 81 in an identical manner as hereinbefore described with regards to the third embodiment.

Final Remarks

A particular application of the invention relating to a SIM card has been described. However, the invention is also applicable to others types of portable object, for example, memory card widely used for storing data (e.g. multimedia memory like SD card, MMC card, etc. . . . ), smart-card or microprocessor type cards used for banking application or security application, etc. . . .

Also, a particular application of the invention relating to mobile telecommunication application has been described. However, the invention is also applicable to other type of applications, for example, photo, video, audio application, banking application, security application.

The plurality of connection elements that have been previously mentioned with regards to all the presented embodiments may be balls of a ball grid array for flip-chip type connection.

The drawings and their description hereinbefore illustrate rather than limit the invention.

Any reference sign in a claim should not be construed as limiting the claim. The word "comprising" does not exclude the presence of other elements than those listed in a claim. The word "a" or "an" preceding an element does not exclude the presence of a plurality of such element.

The invention claimed is:

1. A portable object connectable package for an electronic device comprising:
    a semiconductor die package comprising a top surface and an opposite bottom surface, the bottom surface comprising a plurality of connection elements for connecting to a printed circuit board; and
    a connector body mechanically supported by the semiconductor die package and comprising a plurality of resilient electrical connecting elements extending over the top surface for contacting with a portable object having a contacting area, wherein the portable object connectable package is arranged to be coupled to a portable object positioner for removably positioning the contacting area of the portable object in contact with the plurality of resilient electrical connecting elements when the portable object is present in the portable object positioner.

2. A portable object connectable package according to claim 1, wherein the semiconductor die package comprises a semiconductor die, the connector body being electrically isolated from the semiconductor die.

3. A portable object connectable package according to claim 1, wherein the plurality of resilient electrical connecting elements are electrically connected to the plurality of connection elements for connecting the printed circuit board to the semiconductor die package.

4. A portable object connectable package according to claim 1, wherein the plurality of resilient electrical connecting elements are electrically connected to a bottom of the semiconductor die package through feed-through vias of the semiconductor die coupling the top surface to the bottom surface.

5. A portable object connectable package according to claim 1, wherein the plurality of resilient electrical connecting elements comprises additional connectors for directly connecting to the printed circuit board.

6. A portable object connectable package according to claim 1,
wherein each resilient electrical connecting element of the plurality of resilient electrical connecting elements comprises a connecting lead, said connecting lead comprising a supporting portion mechanically supported by the top surface and a contacting portion protruding over the top surface.

7. A portable object connectable package according to claim 1, wherein:
the semiconductor die package further comprises side surfaces extending substantially vertically between the top surface and the opposite bottom surface,
each resilient electrical connecting element of the plurality of resilient electrical connecting elements comprises a connecting lead, said connecting lead comprising a supporting portion mechanically supported by the side surface and a contacting portion protruding over the top surface.

8. A portable object connectable package according to claim 1, wherein the resilient electrical connecting elements comprise first and second connecting leads, the first connecting lead facing the second connecting lead and extending substantially on half the length of the semiconductor die package.

9. A portable object connectable package according to claim 1, wherein the resilient electrical connecting elements comprise first and second connecting leads, the first connecting lead being shifted from the second connecting lead, each connecting lead extending substantially on the entire length of the semiconductor die package.

10. A portable object connectable package according to claim 6, wherein said connecting lead further comprises an intermediate portion between the supporting portion and the contacting portion, the intermediate portion being mechanically supported by the top surface.

11. A portable object connectable package according to claim 6, wherein the contacting portion protrudes substantially diagonally from the supporting portion over the top surface.

12. A portable object connectable package according to claim 6, wherein the contacting portion protrudes substantially diagonally from the intermediate portion over the top surface.

13. A portable object connectable package according to claim 6, wherein the contacting portion further comprises a substantially crook-shaped distal part directed towards the top surface.

14. A portable object connectable package according to claim 6, wherein the supporting portion comprises a massive part protruding laterally, said massive part comprising fins.

15. A portable object connectable package according to claim 1, wherein the resilient electrical connecting elements comprise a thin laminate wrapped around a portion of the semiconductor die package, the thin laminate comprising an array of flexible contacts.

16. A portable object connectable package according to claim 1, wherein the portable object positioner comprises a frame secured to the semiconductor die package and at least one abutment for limiting the movement of the portable object relatively to the connector body.

17. A portable electronic device comprising:
a printed circuit board;
a portable object positioner; and
a portable object connectable package including:
a semiconductor die package comprising a top surface and an opposite bottom surface, the bottom surface comprising a plurality of connection elements connected to the printed circuit board; and
a connector body mechanically supported by the semiconductor die package and comprising a plurality of resilient electrical connecting elements extending over the top surface for contacting with a portable object having a contacting area, wherein the portable object connectable package is arranged to be coupled to the portable object positioner for removably positioning the contacting area of the portable object in contact with the plurality of resilient electrical connecting elements when the portable object is present in the portable object positioner.

18. The portable electronic device of claim 17, wherein the semiconductor die package comprises a semiconductor die, the connector body being electrically isolated from the semiconductor die.

19. The portable electronic device of claim 17, wherein the plurality of resilient electrically connecting elements are electrically connected to the plurality of connection elements for connecting the printed circuit board to the semiconductor die package.

20. The portable electronic device of claim 17, wherein the plurality of resilient electrical connecting elements are electrically connected to a bottom of the semiconductor die package through feed-through vias of the semiconductor die coupling the top surface to the bottom surface.

21. The portable electronic device of claim 17, wherein the plurality of resilient electrical connecting elements comprises additional connectors for directly connecting to the printed circuit board.

22. The portable electronic device of claim 17, wherein:
the semiconductor die package further comprises side surfaces extending substantially vertically between the top surface and the opposite bottom surface,
each resilient electrical connecting lead, said connecting lead comprising a supporting portion mechanically supported by the side surface and a contacting portion protruding over the top surface.

23. The portable electronic device of claim 17, wherein the resilient electrical connecting elements comprise first and second connecting leads, the first connecting lead facing the second connecting lead and extending substantially on half the length of the semiconductor die package.

24. The portable electronic device of claim 17, wherein the resilient electrical connecting elements comprise first and second connecting leads, the first connecting lead being shifted from the second connecting lead, each connecting lead extending substantially on the entire length of the semiconductor die package.

25. The portable electronic device of claim 17, wherein each resilient electrical connecting element of the plurality of resilient electrical connecting elements comprises a connecting lead, said connecting lead comprising a supporting portion mechanically supported by the top surface and a contacting portion protruding over the top surface.

26. The portable electronic device of claim 25, wherein said connecting lead further comprises an intermediate portion between the supporting portion and the contacting portion, the intermediate portion being mechanically supported by the top surface.

27. The portable electronic device of claim 25, wherein the contacting portion protrudes substantially diagonally from the supporting portion over the top surface.

28. The portable electronic device of claim 25, wherein the contacting portion protrudes substantially diagonally from the intermediate portion over the top surface.

29. The portable electronic device of claim 25, wherein the contacting portion further comprises a substantially crook-shaped distal part directed towards the top surface.

30. The portable electronic device of claim 25, wherein the supporting portion comprises a massive part protruding laterally, said massive part comprising fins.

31. The portable electronic device of claim 25, wherein the resilient electrical connecting elements comprise a thin laminate wrapped around a portion of the semiconductor die package, the thin laminate comprising an array of flexible contacts.

32. The portable electronic device of claim 17, wherein the portable object positioner comprises a frame secured to the semiconductor die package and at least one abutment for limiting the movement of the portable object relatively to the connector body.

* * * * *

UNITED STATES PATENT AND TRADEMARK OFFICE
CERTIFICATE OF CORRECTION

PATENT NO.        : 7,692,280 B2                                    Page 1 of 1
APPLICATION NO.   : 11/910449
DATED             : April 6, 2010
INVENTOR(S)       : Stefan Marco Koch et al.

It is certified that error appears in the above-identified patent and that said Letters Patent is hereby corrected as shown below:

Column 14
Claim 22, Lines 42-45, "each resilient electrical connecting lead, said connecting lead comprising a supporting portion mechanically supported by the side surface and a contacting portion protruding over the top surface." should read as --each resilient electrical connecting element of the plurality of resilient electrical connecting elements comprises a connecting lead, said connecting lead comprising a supporting portion mechanically supported by the side surface and a contacting portion protruding over the top surface.--.

Signed and Sealed this
Fifth Day of April, 2011

David J. Kappos
*Director of the United States Patent and Trademark Office*